United States Patent [19]

Sano

[11] 4,455,674
[45] Jun. 19, 1984

[54] AMPLITUDE-MODULATED SIGNAL RECEIVER HAVING A VARIABLE Q CIRCUIT

[75] Inventor: Shoji Sano, Sagamihara, Japan

[73] Assignee: Victor Company of Japan Limited, Yokohama, Japan

[21] Appl. No.: 349,340

[22] Filed: Feb. 16, 1982

[30] Foreign Application Priority Data

Feb. 19, 1981 [JP] Japan .............................. 56-22383[U]
Mar. 5, 1981 [JP] Japan .............................. 56-30530[U]

[51] Int. Cl.³ .......................... H04B 1/16; H04H 5/00
[52] U.S. Cl. ........................................ 381/15; 455/266
[58] Field of Search ............................ 455/266; 381/15

[56] References Cited

U.S. PATENT DOCUMENTS

| | | | |
|---|---|---|---|
| 2,947,859 | 8/1960 | MacDonald | 455/266 |
| 3,872,387 | 3/1975 | Banach | 455/266 X |
| 3,931,576 | 1/1976 | Csicsatka et al. | 455/266 X |
| 4,352,208 | 9/1982 | Schroeder | 455/266 |
| 4,370,520 | 1/1983 | Malchow | 381/15 |

Primary Examiner—R. J. Hickey
Attorney, Agent, or Firm—Pollock, VandeSande & Priddy

[57] ABSTRACT

In an AM radio signal receiver, the value of Q of the input tuning circuit is varied in accordance with information indicative of the magnitude of the received signal. This information may be derived from the intermediate frequency (IF) signal processing stage of a superheterodyne receiver. In such a case, the IF signal is applied to a narrow-band filter having a pass band which is narrower than that of the IF signal processing stage. The amplitude of the output signal from the narrow-band filter is then detected to control a variable resistance element which is connected in parallel with winding of an input tuning coil so that the value of Q of the input tuning circuit is lowered when receiving a broadcasting signal having relatively high intensity. The invention may be adapted to an AM stereo receiver. In this case, the variable resistance element is controlled by both a signal indicative of the amplitude of the received signal and a signal indicating that the received signal is a stereo signal.

16 Claims, 16 Drawing Figures

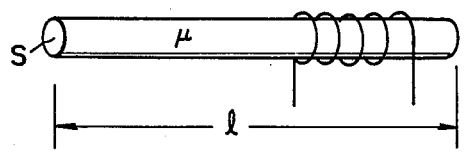
FIG. 1
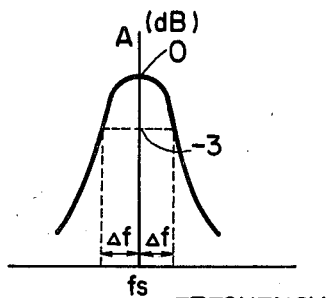
FIG. 2
FIG. 3
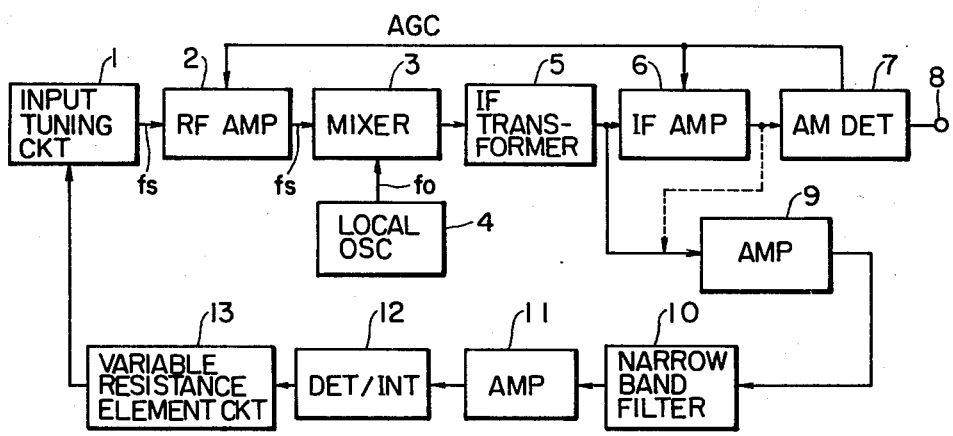
FIG. 4
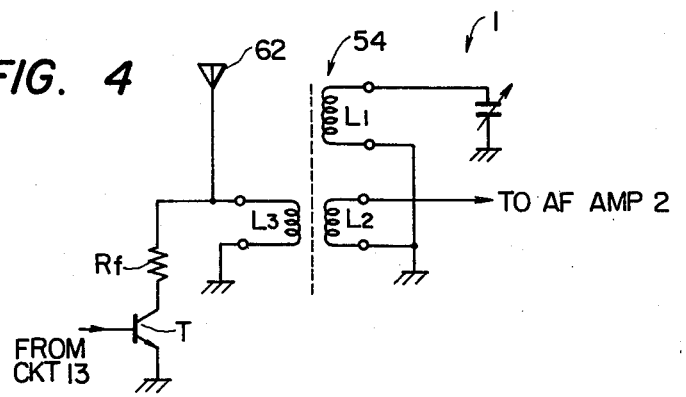

AMPLITUDE-MODULATED SIGNAL RECEIVER HAVING A VARIABLE Q CIRCUIT

BACKGROUND OF THE INVENTION

This invention relates generally to amplitude-modulated (AM) signal receivers having high sensitivity and selectivity and providing high-fidelity reproduction.

As is well known, in order to increase the sensitivity and selectivity of a radio receiver the value of Q in the input tuning circuit should be made as high as possible. However, a very sharp selectivity suffers from a drawback that high-fidelity (hi-fi) in the demodulated audio signals is apt to be lost. Since the selectivity of AM signal receivers is usually set to a relatively high value so that practical receiving ability is ensured even if the receiver is used at a point of low radio field strength, hi-fi reproduction could not be obtained even if the receiver is used at a point of high radio field strength. Although it is theoretically possible to simply lower the Q value of the input tuning circuit when it is intended to widen the tuned frequency range to obtain higher-fidelity when the radio field strength is sufficiently high so that extremely sharp selectivity and sensitivity are unnecessary, such a simple decrease in Q will result in deterioration in tuning operation. Namely, assuming that the listener wishes to tune the receiver on a broadcasting signal frequency whose intensity is relatively low while the objective signal frequency is close to another broadcasting signal frequency having relatively high intensity, it would be impossible to select the objective signal if the value of Q of the input tuning circuit were lowered.

Apart from the above problem, when it is intended to receive an amplitude-modulated stereo signal with an AM stereo receiver, it is desirable if the hi-fi characteristic of the receiver is improved as long as the selectivity and sensitivity are maintained above necessary values.

SUMMARY OF THE INVENTION

The present invention has been developed in order to remove the above-mentioned drawbacks or problems inherent to the conventional AM radio receivers.

It is, therefore, an object of the present invention to provide an AM receiver having a variable Q circuit so that Q of the input tuning circuit can be desirably controlled without suffering from problems caused by decrease in selectivity and sensitivity which are needed for tuning at a relatively low intensity signal.

In accordance with the present invention there is provided an AM signal receiver comprising: an input tuning circuit for selecting a desired AM radio frequency signal; a frequency-converting circuit for converting said selected AM radio frequency signal fed from said input tuning circuit into an intermediate frequency signal having a predetermined center frequency; an intermediate frequency signal processing circuit for passing only a given frequency range centering said intermediate frequency; an AM detector for detecting an audio signal included in the output signal fed from said intermediate frequency signal processing circuit; a narrow-band filter responsive to the output signal from said intermediate frequency signal processing circuit, the pass band of said narrow-band filter being narrower than that of said intermediate frequency signal processing circuit; first means for detecting the magnitude of the output signal from said narrow-band filter for producing an output signal indicative of said magnitude; and second means for varying the value of Q of said input tuning circuit in accordance with said output signal from said first means.

In accordance with the present invention there is also provided an AM signal receiver comprising: an input tuning circuit for selecting a desired AM radio frequency signal; and a signal processing circuit for demodulating the selected signal to obtain left and right channel audio signals, wherein the improvement comprises: first means for detecting the amplitude of the received AM radio signal; second means for detecting that the AM receiver is tuned to a stereo broadcasting signal; and third means responsive to said first and second means for lowering the value of Q of said input tuning circuit when the AM receiver is receiving a stereo broadcasting signal having an intensity which is greater than a predetermined value.

In accordance with the present invention there is further provided an AM signal receiver comprising: an input tuning circuit for selecting a desired AM radio frequency signal; a frequency-converting circuit for converting said selected AM radio frequency signal fed from said input tuning circuit into an intermediate frequency signal having a predetermined center frequency; an intermediate frequency signal processing circuit for passing only a given frequency range centering said intermediate frequency; an AM detector for detecting a component, corresponding to the sum of the left and right channel signals, included in the output signal fed from said intermediate frequency signal processing circuit; a sub channel signal demodulating circuit for detecting a component, corresponding to the difference between the left and right channel signals, included in the output signal fed from said intermediate frequency signal processing circuit; a stereo identification signal detector responsive to the difference component from said sub channel signal demodulating circuit for producing an output signal in the presence of said difference component; a matrixing circuit responsive to the sum component from said AM detector and to said difference component from said sub channel demodulating circuit for separating said left and right channels in the presence of the output signal from said stereo identification signal detector; first means for detecting the magnitude of the output signal from said intermediate frequency signal processing circuit for producing an output signal indicative of said magnitude; and second means responsive to both said output signal from said stereo identification signal detector and said output signals from said first means for lowering the value of Q of said input tuning circuit only when said AM stereo signal receiver receives a stereo broadcasting signal having a level which is greater than a predetermined value.

BRIEF DESCRIPTION OF THE DRAWINGS

The object and features of the present invention will become more readily apparent from the following detailed description of the preferred embodiments taken in conjunction with the accompanying drawings in which:

FIG. 1 is a schematic perspective view of a ferrite bar antenna used in an AM receiver to which the invention is adapted;

FIG. 2 is an explanatory graph showing a frequency characteristic of an input tuning circuit of the AM receiver;

FIG. 3 is a schematic block diagram of an embodiment of the AM receiver according to the present invention;

FIG. 4 is a circuit diagram of the input tuning circuit and the variable resistance circuit of FIG. 3;

The same or corresponding elements and parts are designated at like numerals throughout the drawings.

DETAILED DESCRIPTION OF THE INVENTION

Figure 6:
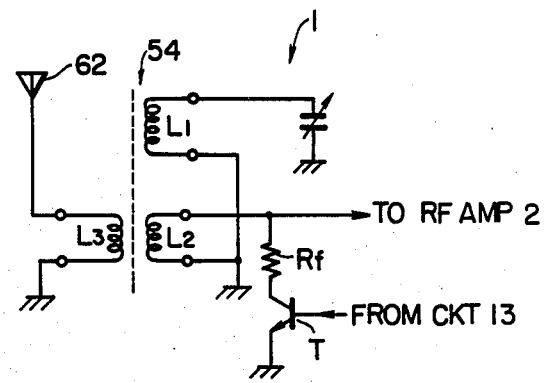
FIG. 6 is another modification of the arrangement of FIG. 4.

Prior to describing the embodiments of the present invention, the above-described problems in the conventional AM receivers will be discussed for a better understanding of the present invention.

In many conventional AM receivers, an input tuning circuit or antenna circuit is constructed of a parallel resonance circuit having a coil, such as a ferrite bar antenna, and a variable capacitor. When a ferrite bar antenna comprising a coil wound around a ferrite core having cross-sectional area S, permeability $\mu$, length l, such as shown in FIG. 1 is used, the maximum output power Pmax which can be derived therefrom is given by:

$$Pmax = 1.39 fs \cdot l \cdot S \cdot k \cdot E^2 \cdot \mu \cdot Qo \cdot 10^{-11} \, [W] \qquad (1)$$

wherein
fs is the receiving frequency;
k is a constant of the ferrite core;
E is radio field strength (electric field intensity);
Qo is the value of Q of the coil in the absence of load.

As is apparent from Eq. (1), the maximum power Pmax is proportional of Qo. Accordingly, higher Q will result in higher sensitivity of the AM receiver.

FIG. 2 shows a pass band characteristic of an input tuning circuit using such a ferrite bar antenna, and it will be understood that the input tuning circuit exhibits a single-peak characteristic centering the receiving frequency fs as shown in FIG. 2. The reference $\Delta f$ indicates a frequency range corresponding to the difference between the center frequency fs and a frequency where the input signal level is attenuated by 3 dB from the level at fs. The attenuation factor A of the ferrite bar antenna is given by:

$$A = 20 \log \sqrt{\left(\frac{2\Delta f Qo}{fs}\right)^2 - 1} \qquad (2)$$

As is understood from Eq. (2), as the Q of the resonance circuit of the input tuning circuit increases, so does the value of "A" in the case that $\Delta f$ is maintained constant. The pass band narrows as the value of Qo increases.

On the other hand, when considering the frequency characteristic on demodulation in an AM receiver, a wider pass band of the input tuning circuit is advantageous for hi-fi reproduction. For instance, assuming that Qo = 100 and fs = 1000 KHz, the value of $\Delta f$ will be calculated from Eq. (2) as approximately 3 KHz/−3 dB. This means that the input signal is limited by the pass band of the input tuning circuit even if the pass band of the IF (intermediate frequency) signal processing stage is made wide.

FIG. 3 illustrates a schematic block diagram of an embodiment of the AM receiver according to the present invention. The reference 1 is an input tuning circuit having a parallel resonance circuit constructed of a coil, such as a ferrite bar antenna, and a variable capacitor. An input AM radio frequency signal fs received and tuned by the input tuning circuit 1 is fed via an RF (radio frequency) amplifier 2 to a mixer 3. Then the AM signal is mixed with a local oscillation signal fo from a local oscillator 4 to be converted into frequencies expressed in terms of fs±fo, and this frequency-converted signal is fed to an IF transformer 5. One given frequency signal between the two frequencies fs±fo is taken out as an IF signal, and this IF signal is then amplified by an IF amplifier 6 to be fed to a detecting circuit 7. AM demodulation is performed in the detecting circuit 7 to detect an audio signal, which is outputted from an output terminal 8 in turn. A signal derived from a portion of the detecting circuit 7 is fed, as an AGC voltage, to the RF amplifier 2 and to the IF amplifier 6 respectively so as to control the amplification degree of these circuits in accordance with the intensity of the received AM signal.

The above-described structure is substantially the same as that of conventional AM receivers, but the AM receiver according to the present invention has additional blocks 9 to 13 which will be described hereinbelow. Namely, the output signal from the IF transformer 5 is fed via an amplifier 9 to a narrow-band filter 10. Alternatively, the IF signal from the IF amplifier 6 may be applied to the amplifier 9 in place of the output signal from the IF transformer 5 as indicated by a dotted line. The narow-band filter 10 has an electrical characteristic that the pass band thereof is narrower than that of the IF transformer 5 and the center frequency of the pass band thereof equals the intermediate frequency. Therefore, the IF signal passed through the narrow-band filter 10 has a frequency range which is narrower than that of the IF signal at the output terminal of the IF transformer 5. This narrowed IF signal is fed via an amplifier 11 to a detector/integrator 12 in which the AM signal (narrowed IF signal) is integrated or rectified to eliminate the audio signal so that the integrated or rectified signal becomes a D.C. voltage. This D.C. voltage rises and drops in accordance with the intensity of the received AM signal. Then this variable D.C. voltage is applied to a variable resistance circuit 13 which is connected to the input tuning circuit 1. The variable resistance circuit 13 includes an element whose resistance is variable depending on a voltage applied thereto. In detail, the resistance is arranged to inversely proportional to the voltage applied thereto, and therefore, when the radio field strength is above a practical level, the resistance drops below a given level. The variable resistance element is connected in parallel to one of the windings of a coil of the input tuning circuit 1, as will be described hereinafter, so that reduction in resistance will cause the input tuning circuit 1 to lower or damp the value of Q thereof.

FIG. 4 to 7 show various embodiments of the combination of the input tuning circuit 1 and the variable resistance circuit 13 of FIG. 3. In FIGS. 4 to 7, the reference L3 is a primary winding of an input tuning coil 54 having a secondary winding L1 and an RF pickup coil L2. The primary winding L3 functions as an antenna or is connected to an external antenna 62 and the secondary winding L1 is connected in parallel with a variable capacitor with which tuning is effected. The tuned frequency signal is picked up by the pickup coil L2 to be fed to the RF amplifier 2 of FIG. 3. In the embodiment of FIG. 4, the variable resistance element, which may be a transistor or FET, is connected in parallel with the primary winding L3. In detail, the collector-emitter path of a transistor T is connected via a fixed resistor Rf to both terminals of the primary winding L3, where the base of the transistor T is responsive to the current from the detector/integrator 12 of FIG. 3. An FET (not shown) may also be used in the same manner in place of the transistor T.

Figure 5:
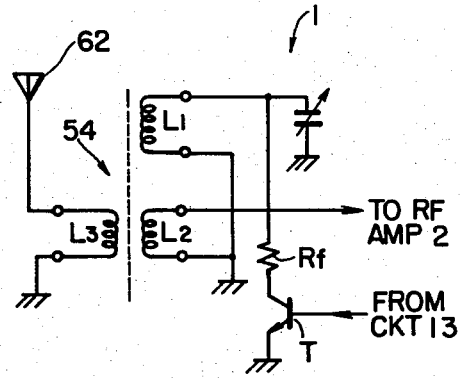
FIG. 5 is a modification of the arrangement of FIG. 4.
Figure 7:
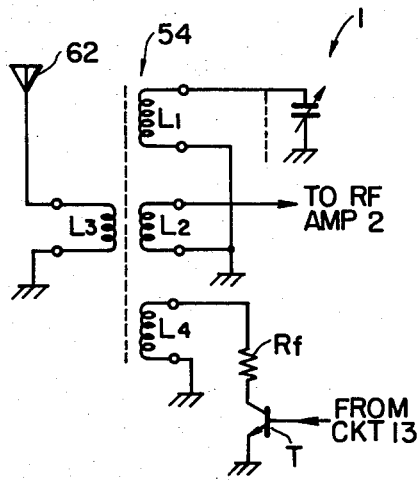
FIG. 7 is a further modification of the arrangement of FIG. 4.

In the embodiment of FIG. 5, a transistor T functioning as the variable resistance element is connected in parallel with the secondary winding L1 through a fixed resistor Rf. In another embodiment of FIG. 6, a transistor T functioning as the variable resistance element is connected in parallel with the pickup coil L2 through a fixed resitor Rf. In a further embodiment of FIG. 7, an additional winding L4 is provided to be connected in parallel with a transistor T functioning as the variable resistance element in the same manner.

Figure 8:
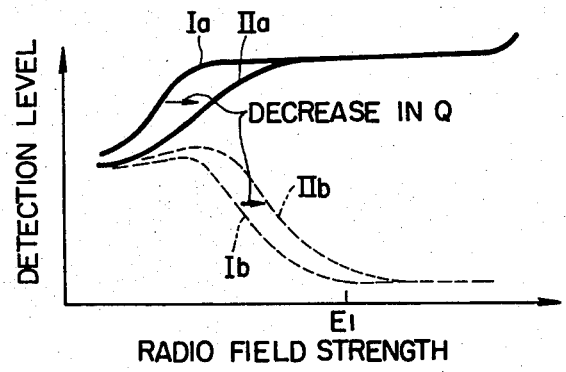
FIG. 8 is an explanatory graph showing the relationship between the output level from the detecting circuit of FIG. 3 and the electric field intensity.

The meaning of the above-mentioned practical radio field strength will be described with reference to FIG. 8 which shows the relationship between the radio field strength of a received AM signal and amplitude or level of the output signal from the AM detector 7. In the graph of FIG. 8, solid curves Ia and IIa indicate the amplitude of the detected signal, while dotted curves Ib and IIb indicate the amplitude of noise occurring when no signal is received. Curves Ia and Ib indicate amplitudes under the condition that the value of Q of the input tuning circuit 1 is of a predetermined value, while curves IIa and IIb indicate amplitude under the condition that Q has been lowered below the predetermined value. Namely, when Q is lowered, the sensitivity of the AM receiver of FIG. 3 lowers as indicated by the shifting from the curve Ia to IIa and from the curve Ib to IIb. The above-mentioned practical ratio field strength (electric field strength) corresponds to a value of the radio field strength E1 at which the noise characteristic curve Ib obtained in receipt of no signal starts assuming a constant low value (i.e the left-most point in the lower flat portion in the curve Ib).

Reduction in Q causes the pass band of the input tuning circuit 1 to become wider, and therefore, hi-fi reproduction of the audio signal carried by the received AM signal can be achieved. In accordance with the present invention, since Q is lowered by detecting the magnitude of the received AM signal, i.e. the IF signal from the IF transformer 5 or from the IF amplifier 6, where detection is effected by watching only a narrow band which is narrower than the IF band, undesirable situation that a wanted frequency signal cannot be tuned due to unintended reduction in Q can be avoided. Namely, when the radio field strength of a wanted frequency signal is below the practical radio field strength, or when the receiver is slightly detuned from a wanted frequency signal having sufficient radio field strength, the variable resistance circuit 13 is controlled so that the resistance thereof exceeds a predetermined value. Accordingly, the value of Q of the input tuning circuit 1 is maintained high for receiving such a weak signal or to facilitate tuning.

In the arrangement of FIG. 3 showing a superheterodyne AM receiver having a variable Q circuit, the amplifiers 9 and/or 11 may be omitted if unnecessary. Furthermore, in the illustrated examples of FIGS. 4 to 7, although the resistance across the collector-emitter path of the transistor T is continuously changed by the current applied to the base of the transistor T, it is possible to stepwisely change the resistance of such a variable resistance element.

Prior to describing a further embodiment of the present invention which is directed to AM stereo receivers, the structure and operation of a conventional AM stereo receiver will be described with reference to FIG. 9.

In an AM stereo broadcasting system, monaural information, stereo information and a stereo identification signal ID are all superposed on the carrier wave. The monaural information includes a component expressed in terms of (L+R), while the stereo information includes a component expressed in terms of (L−R) wherein L and R respectively indicate the left channel audio signal and the right channel audio signal. The stereo identification signal ID functions as a pilot signal. In such an AM stereo broadcasting system, an angle-modulation method, such as frequency-modulation (FM), phase-modulation (PM) or the like, is used for transmitting the stereo information in addition to the monaural information which is transmitted by using normal amplitude-modulation method.

For instance, in an AM stereo broadcasting system according to Magnavox (trademark), AM and PM are combined where PM is effected such that frequency deviation varies linearly with respect to the modulation signal frequency. In detail, the carrier wave is amplitude-modulated by the signal (L+R), and also the carrier wave is phase-modulated by the signal (L−R) before being transmitted. The stereo identification signal ID is transmitted by phase-modulating the carrier wave by 5 Hz±3.3 rad.

Figure 9:
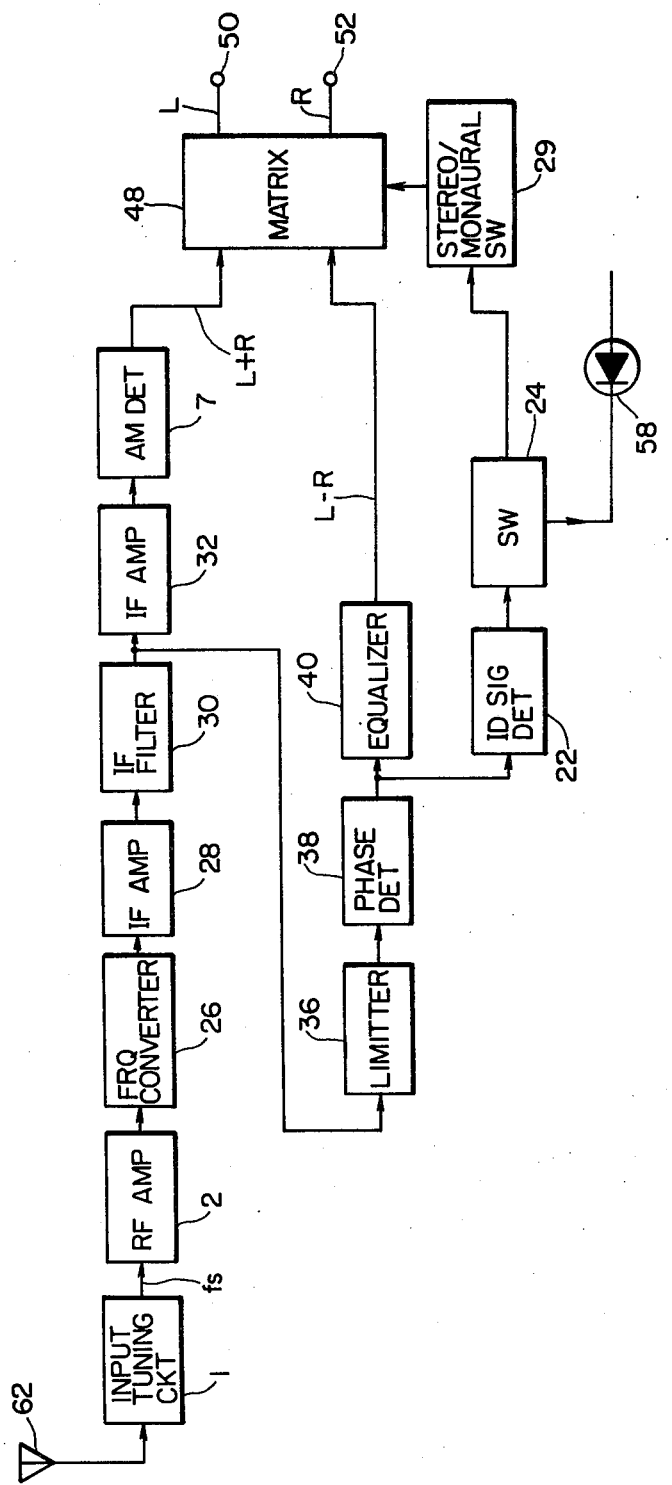
FIG. 9 is a block diagram of a conventional AM stereo receiver.

FIG. 9 shows a block diagram of a conventional AM stereo receiver of a superheterodyne type. In order to convert the received radio frequency into an IF signal of 450 KHZ, the radio frequency input from an antenna 62 is first tuned in an input circuit 1, and is then amplified in an RF amplifier 2. Then the amplified RF signal is fed to a frequency converter 26 having a mixer and a local oscillator in the same manner as in FIG. 3. In the frequency converter 26, the amplified radio frequency is mixed with a local oscillation frequency to obtain an IF output. The IF output is amplified by a first IF amplifier 28 and is then fed via an IF filter 30, in which unnecessary radio frequencies are eliminated, to a second IF amplifier 32 so that further IF amplification is effected.

Among various components of the output signal from the IF amplifier 32, an amplitude-modulated component, i.e. the component (L+R), is detected by an AM detector 7, and thus the detected component (L+R) is fed to a matrixing circuit 48. The output signal from the second IF amplifier 32 is also fed to an amplitude-limiting circuit 36 having a limiter and an amplifier so that the IF signal amplitude is made constant by removing amplitude variation components. Then the constant-amplitude IF signal is fed to a phase detector 38 in which phase modulated components, i.e. (L−R)+ID, are detected. The signal expressed by (L−R)+LD is then fed to a phase equalizer 40, in which phase-frequency distortion is compensated for, before being sent to the matrixing circuit 48. The signal (L−R)+ID is further fed to a stereo identification signal detector 22 in which the stereo identification signal ID is detected. The detected stereo identification signal ID is fed to a switching circuit 24 to turn on a stereo indicator 58. Simultaneously, the stereo identification signal ID is fed to a stereo/monaural switch 29 connected to the matrixing circuit 48. Namely, the stereo/monaural switch 29 is controlled to cause the matrixing circuit 48 to perform necessary matrixing operation for obtaining stereo output signals.

The matrixing circuit 48 performs addition and subtraction by using the signals (L+R) and (L−R) so as to separate the left channel audio signal L and the right channel audio signal R. In the case of receiving a monaural signal, the signal (L+R) is outputted from both output terminals 50 and 52 of the matrixing circuit 48.

In an AM stereo receiver, it is necessary to make the tuned frequency range or pass band wider than that for receiving a monaural signal so as to ensure hi-fi demodulation of the stereo signals. However, a wider tuned frequency range is apt to introduce radio interference with which cross modulation occurs. Cross modulation is a phenomenon which occurs when an interference signal is superposed on the signal intended to receive, and occurs mainly in the RF amplifier 2 of FIG. 9. Therefore, it is desirable that the tuned frequency range in the input tuning circuit 1, which is positioned just before the RF amplifier 24, is adjusted so that wider tuned frequency range is obtained without suffering from the problem of the above-mentioned radio interference.

Figure 10:
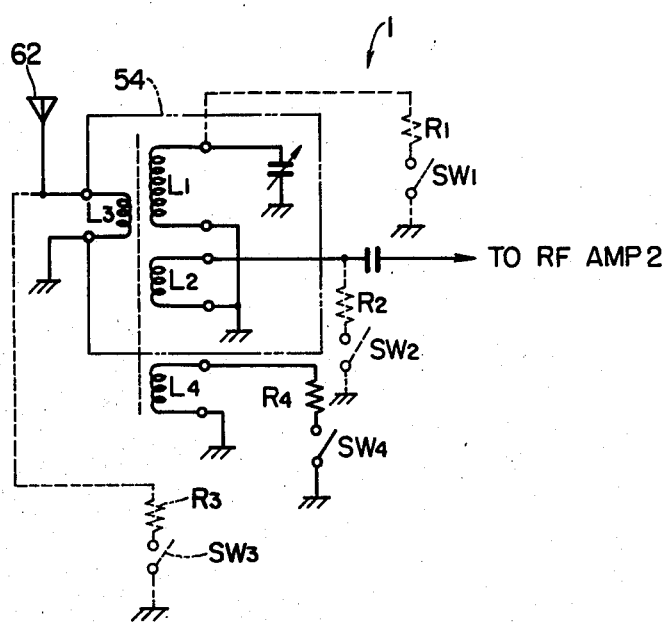
FIG. 10 is a circuit diagram of an input tuning circuit which may be adapted to a another embodiment of the present invention, directed to an AM stereo receiver.

FIG. 10 is a diagram of an input tuning circuit 1 used in an embodiment of the present invention, which is directed to an AM stereo receiver. The input tuning circuit 1 of FIG. 10 is similar to the arrangements of FIGS. 4 to 7, except that a series circuit of a fixed resistor (one of R1 to R4) and a switching circuit (one of SW1 to SW4) is connected to one of the four windings L1 to L4 of the input tuning circuit 1. In FIG. 10, only the series circuit of the switching circuit SW4 and the resistor R4 is shown by solid lines, while other switching circuits SW1 to SW3 and associated resistors R1 to R3 are shown by dotted lines. This means that only one of the series circuits of the switching circuits SW1 to SW4 and the resistors R1 to R4 is required for lowering the value of Q of the input tuning circuit 1. The switching circuit SW1, SW2, SW3 or SW4 is controlled by a signal applied thereto as will be described hereinafter. Namely, when it is intended to widen the tuned frequency range, for instance, when receiving an AM stereo signal having sufficient radio field strength, the switching circuit (one of SW1 to SW4) is closed so that the fixed resistor (one of R1 to R4) is connected in parallel with an associated winding (one of L1 to L4). On the other hand, when receiving a monaural broadcasting signal, the switching circuit (one of SW1 to SW4) is opened so that the fixed resistor (one of R1 to R4) is disconnected from the winding (on of L1 to L4). As a result, the value of Q of the input tuning circuit 1 is not lowered, providing sufficient selectivity and sensitivity required for receiving monaural broadcasting signals.

Figure 11:
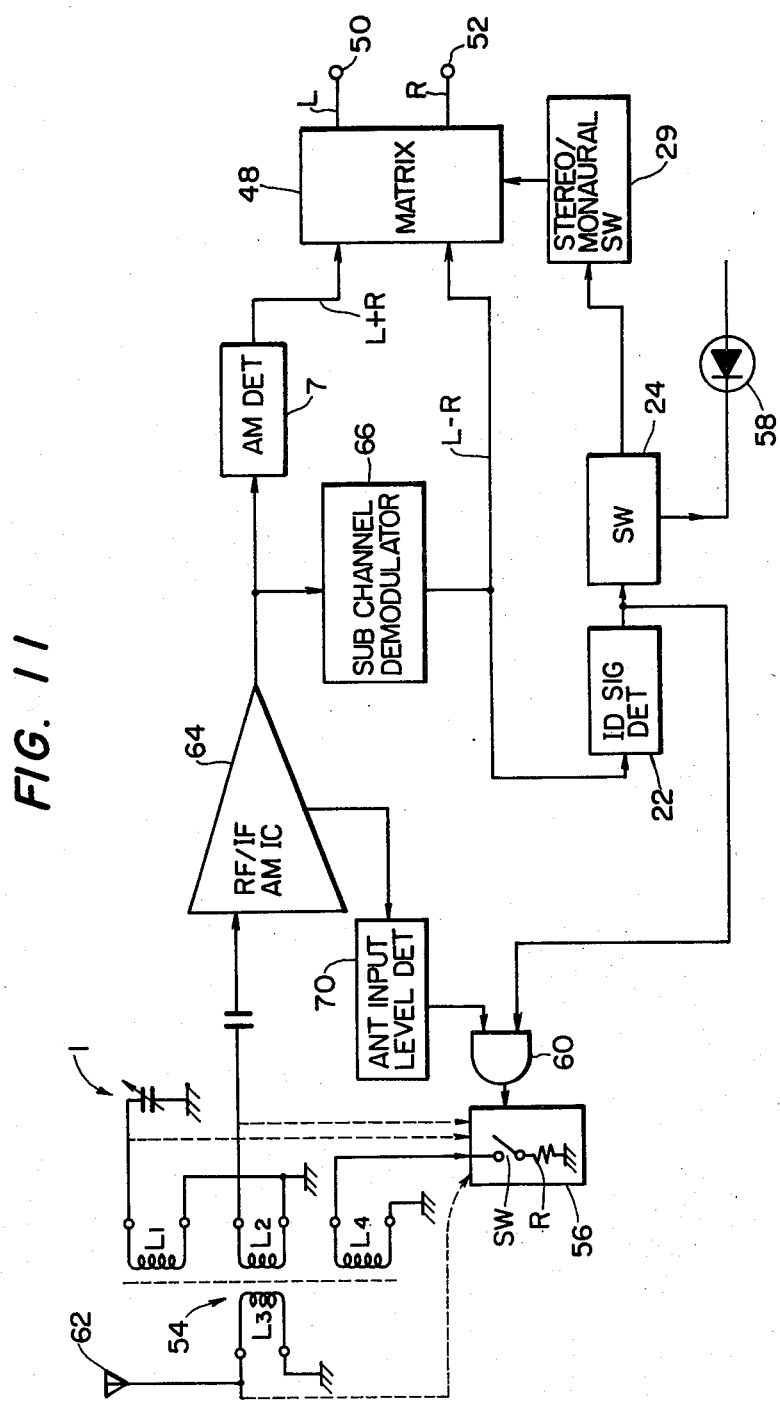
FIG. 11 is a schematic block diagram of the embodiment of an AM stereo receiver.

FIG. 11 is a schematic block diagram of an AM stereo receiver having an input tuning circuit such as described with reference to FIG. 10. In FIG. 11, one of the switching circuits SW1 to Sw4 of FIG. 10 is represented by the reference SW, and one of the fixed resistors R1 to R4 is represented by the reference R. The series circuit of the switching circuit SW and the resistor R is designated at the reference 56. The AM stereo receiver of FIG. 11 comprises an integrated circuit 64 which functions as a part of the RF amplifier 2, the frequency converter 26, the IF filter 30, and the IF amplifiers 28 and 32 of FIG. 9. This integrated circuit 64 is referred to as an RF/IF AM IC. The AM stereo receiver of FIG. 11 further comprises a sub channel demodulating circuit 66 functioning as the combination of the amplitude-limiting circuit 36, the phase detector 38 and the equalizer 40. Therefore, the AM detector 7 demodulates the AM signal, to obtain an output signal as a main channel signal, including (L+R) information, while the sub channel demodulating circuit 66 produces a sub channel signal including (L−R) information. These two pieces of information are respectively fed to the matrixing circuit 48 in the same manner as in the conventional AM stereo receiver of FIG. 9.

The switching circuit SW of the block 56 is controlled basically by a stereo identification signal ID from the stereo identification signal detector 22, where the switching circuit SW may be a semiconductor switch such as a transistor. The stereo indication signal detector 22 is responsive to the (L−R) information from the sub channel demodulating circuit 66, and is arranged to produce a logic "1" signal when (L−R) information is applied thereto. The RF or IF signal is derived from the RF/IF AM IC 64 to be fed to an antenna input level detector 70 so that the antenna input level detector 70 produces a logic "1" signal when the radio field strength of the received AM signal is greater than a predetermined value. Namely, this antenna input level detector 70 substantially corresponds to the detector/integrator 12 of FIG. 3, and may be constructed by adding a logic signal producing circuit to the detector/integrator 12. An AND gate 60 is responsive to the logic "1" signals from the antenna input level detector 70 and from the stereo identification signal detector 22 so that a logic "1" signal is produced and fed to the switching circuit SW of the block 56 in the presence of logic "1" signals.

With this arrangement, the switching circuit SW of the block 56 is turned on when receiving an AM stereo signal having an intensity greater than the predetermined value. Thus, the value of Q of the input tuning circuit 1 is lowered, and therefore, hi-fi reproduction is possible. In other words, sensitivity and demodulating frequency characteristics of the AM stereo receiver are both set to values which are satisfactory for stereo reproduction. On the other hand, in the case of receiving a broadcasting signal having low radio field strength, the switching circuit SW is maintained open. Accordingly, the value of Q is not lowered so that necessary selectivity and sensitivity are obtained.

A manual switch 42 is provided for forcibly controlling the AM stereo receiver so that monaural signal reproduction is performed even in the case of receiving a stereo signal. Namely, the switch 42 is connected to an unshown voltage source, and is arranged to send the voltage to the stereo identification signal detector 22. The stereo identification signal detector 22 is arranged to produce a logic "0" signal in receipt of the voltage from the switch 42 irrespective of the information from the sub channel demodulating circuit 66. This manual switch 42 is useful for the receiver to forcibly change its operation from stereo signal reproduction to monaural signal reproduction. Namely, when it is intended to operate the AM stereo receiver as a monaural signal receiver so that cross-modulation is removed or signal-to-noise ratio is improved, the manual switch 42 is turned on.

In the embodiment of FIG. 11, although the output signal from the AND gate 60 is shown to be directly fed to the block 56, a suitable waveform shaping circuit, such as a schmitt trigger circuit, may be interposed between these two circuits 60 and 56. Such a waveform shaping circuit produces a rectangular signal with which malfunction of the switching circuit SW can be effectively prevented.

Figure 12:
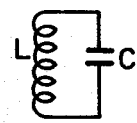
FIGS. 12 to 15 are explanatory diagrams for the description of the operation of the AM receiver according to the present invention.

The above-described selectivity changing operation in the AM stereo receiver will be further described in detail with reference to FIGS. 12 to 15. Generally speaking, a resonance circuit in an input tuning circuit of an AM radio receiver is constructed of a parallel circuit of an inductor (coil) L and a capacitor C as shown in FIG. 12. The tuning selectivity of such a resonance circuit can be expressed by the sharpness Q of the inductor L. Assuming that the reference $Q_o$ represents the sharpness of the inductor L in the absence of load, $Q_o$ is given by:

$$Q_o = \frac{fs}{2\Delta f} \sqrt{\left(\frac{eo}{el}\right)^2 - 1} \quad (3)$$

wherein
fs is resonance frequency;
eo is resonance voltage;
$\Delta f$ is positive or negative frequency variation from the resonance frequency fs; and
el is resonance voltage across the inductor L when the frequency of the input signal is shifted by $\Delta f$ from the resonance frequency fs:

The resonance output level is expressed in terms of an attenuation factor "A" [dB] as given by Eq. (2) because $$A = 20 \log (eo/el)$$

Figure 13:
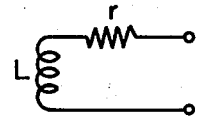
Figure 14:
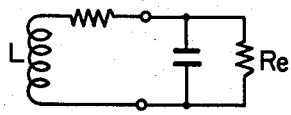

FIG. 13 illustrates the relationship between the frequency and the voltage across the inductor L. On the other hand, $Q_o$ of a coil, whose equivalent circuit is shown in FIG. 14, is given by:

$$Q_o = (\omega s \cdot L)/r \quad (4)$$

wherein
L is the inductance of the coil;
r is the internal resistance of the coil; and $\omega s$ is the angular frequency, and equals $2\pi fs$.

By rearranging Eq. (2) by substituting Eq. (4) into Eq. (2) we obtain:

$$A = 20 \log \sqrt{\left(\frac{4\pi \Delta f \cdot L}{r}\right)^2 + 1} \quad (5)$$

Figure 15:
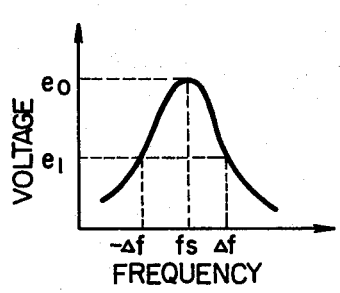

As indicated by Eq. (5), "A" has no connection with $Q_o$. However, in an actual input tuning circuit, the tuning coil is connected to external resistance elements, such as a load resistance. FIG. 15 shows an equivalent circuit of a parallel resonance circuit connected to an external resistance element Re. The resonance impedance of the parallel resonance circuit is given by:

$$\begin{aligned} Zr &= Q_o \cdot \omega s \cdot L \\ &= Q_o \cdot 2\pi fs \cdot L \end{aligned} \quad (6)$$

Suppose that the external resistance element Re is 200 Kohms, the combined impedance of the resonance impedance and the external resistance element (Re=200 Kohms) can be obtained by substituting the values of Qo, fs and L. Assuming that this combined impedance is expressed in terms of Zc, the value of Q in the presence of the external resistance Re is given by:

$$QL = R/\omega s \cdot L \quad \ldots (7)$$

An example of calculations is given hereinbelow. For instance, assuming that Qo=200, L=299 μH, Re=200 Kohms, the values of QL at 600, 1000 and 1400 KHz are obtained from Eq. (7) with the values of corresponding Zr calculated from Eq. (6) as shown in the following table.

| fs [KHz] | Zr [Kohms] | Zc [Kohms] | QL |
| --- | --- | --- | --- |
| 600 | 151 | 86 | 114 |
| 1000 | 251 | 111 | 88 |
| 1400 | 352 | 127 | 72 |

In the above, it has been assumed that the value of Qo is constant irrespective of the frequency.

In a following step, the value of $\Delta f$ corresponding to $-3$ dB at respective frequencies is obtained from the result of the above table. Since the following relationship:

$$\Delta f = (fs)/(2QL) \quad (8)$$

is obtained from Eq. (3) and the relationship expressed by $eo/el = \sqrt{2}$, the values of QL in the above table are substituted into Eq. (8) to obtain:

$$\Delta f(-3 \text{ dB}/600 \text{ KHz}) \approx 2.63 \text{ KHz}$$

$$\Delta f(-3 \text{ dB}/1000 \text{ KHz}) \approx 5.7 \text{ KHz} \quad (9)$$

$$\Delta f(-3 \text{ dB}/1400 \text{ KHz}) \approx 9.7 \text{ KHz} \quad (9)$$

From the above Eqs. (9), it will be understood that the frequency range of the pass band, in which the attenuation is smaller than $-3$ dB, becomes narrower as the resonance frequency lowers. In other words, the higher frequency signals received by the receiver the wider the pass band will be resulted.

In actual AM receivers on market, the value of QL of the input tuning circuit is usually between 100 and 150, and when QL is over 100 or so, the frequency range of the radio frequency signal is limited, as is apparent from Eqs. (9), by the value of QL of the input tuning circuit including a coil such as the bar antenna shown in FIG. 1. Furthermore, the tuned frequency range or pass band in the input tuning circuit varies with the resonance frequency.

Although the intermediate frequency range can be widened to ±6 KHz or so, paying attention to the prevention of cross modulation, the above-mentioned narrow tuned frequency range in lower frequencies of the received signals has to be widened in order to achieve hi-fi reproduction, especially when receiving a stereo signal.

For instance, let us assume that the value of QL is set to 40. Under this condition, the tuned frequency ranges $\Delta f$ of the input tuning circuit for respective frequencies are given from Eq. (8) as follows:

$$\Delta f(-3 \text{ dB}/600 \text{ KHz}) \approx 7.5 \text{ KHz}$$
$$\Delta f(-3 \text{ dB}/1000 \text{ KHz}) \approx 12.5 \text{ KHz} \quad (10)$$
$$\Delta f(-3 \text{ dB}/1400 \text{ KHz}) \approx 17.5 \text{ KHz}$$

It will be understood from Eqs. (10) that the input tuned frequency ranges for respective frequencies of the radio signals have been widened by lowering the value of QL.

Figure 16:
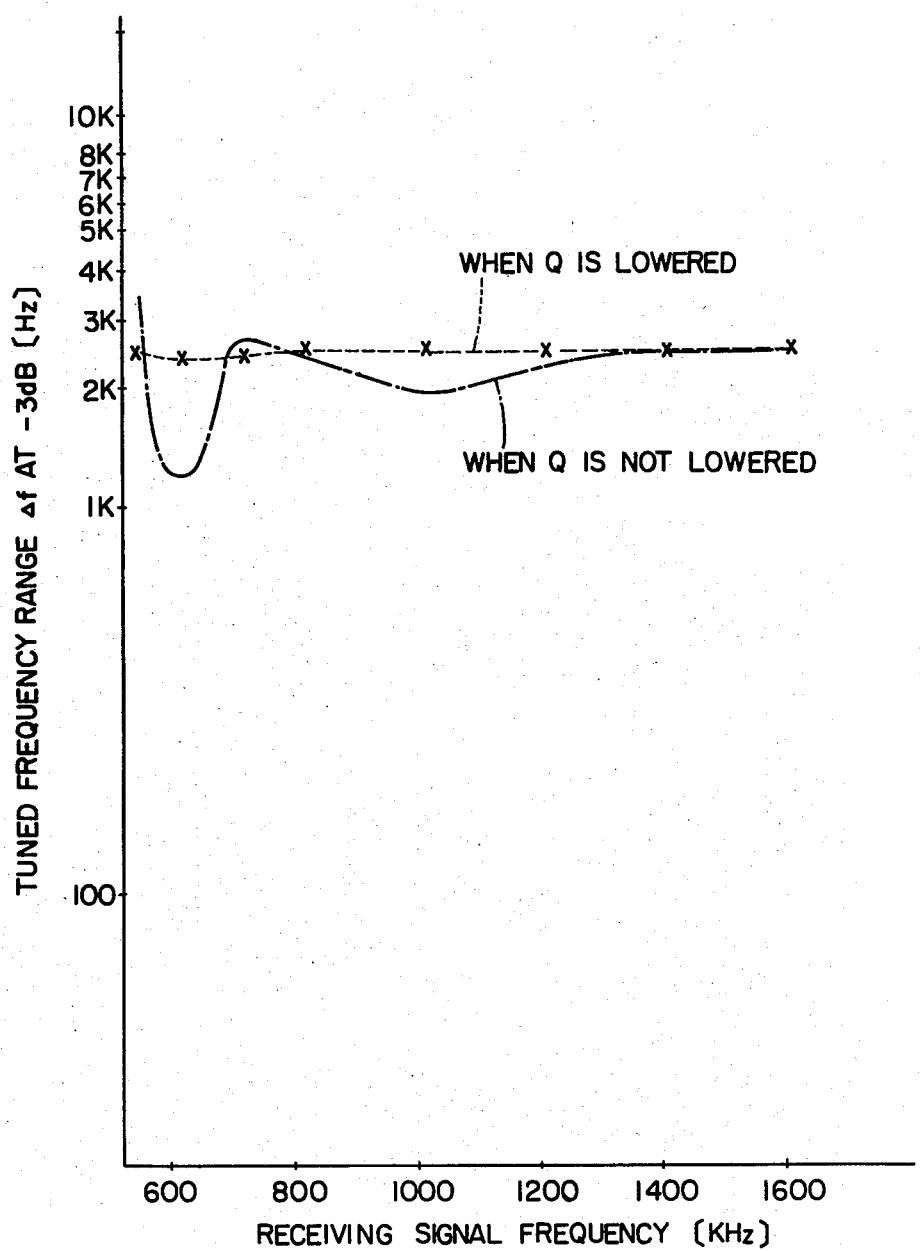
FIG. 16 is a graphical representation showing the frequency range characteristic with respect to receiving frequencies.

FIG. 16 illustrates the total frequency range characteristics of the AM signal receiver, which characteristics are obtained at the output terminal of the AM detector 7. A dotted curve shows the total frequency range characteristic when the value of QL is not lowered (namely, the dotted curve shows the characteristic of the conventional AM receiver), while a solid curve shows the total frequency range characteristic when the value of QL is lowered. Both the dotted and solid curves represent the total frequency range characteristics after tracking and alignment of each resonance circuit of the superheterodyne receiver are performed at three different frequencies, such as 600, 1000 and 1400 KHz. Thus, it will be understood from FIG. 16 that the dotted curve representing the frequency range characteristics obtained when QL is high, fluctuates up and down even if tracking and alignment have been performed. On the other hand the solid curve representing the frequency range characteristic obtained when QL is low, is substantially flat over the entire receiving range. Namely, the frequency characteristic of the demodulated audio signal is substantially flat over the entire receiving frequency range, while the frequency range of the demodulated audio signal has been widened compared to the case that QL is maintained high.

In addition to these advantages, by lowering the value of QL, the phase characteristic in AM stereo demodulation is flattened. When the selectivity is very sharp, phase distortion, which is undesirable for effective separation of the phase-modulated components of an AM stereo signal, occurs in the vicinity of the resonance frequency. However, when the sharpness is dulled by lowering the value of Q, such phase distortion is prevented. Therefore, satisfactory stereo sounds can be obtained from an AM stereo broadcasting signal.

In the above, although it has been described that the antenna input level detector 70 of FIG. 11 substantially corresponds to the detector/integrator 12 of FIG. 3, the narrow-band filter 10 as well as the amplifiers 9 and 11 may be added to the antenna input level detector 70 so that Q of the input tuning circuit 1 is lowered only when the radio receiver is correctly tuned to a stereo broadcasting signal frequency.

Although the embodiment directed to an AM stereo receiver has been described by taking an example using the Magnavox (trademark) system, the present invention may be adapted to AM stereo receivers of other types. Of course, the pesent invention can also be applied to ordinary AM monaural receivers as described with reference to FIG. 3.

The above-described embodiments are just examples of the present invention, and therefore, it will be apparent for those skilled in the art that many modifications and variations may be made without departing from the spirit of the present invention.

What is claimed is:
1. An AM signal receiver comprising:
 (a) an input tuning circuit for selecting a desired AM radio frequency signal;
 (b) frequency-converting circuit for converting said selected AM radio frequency signal fed from said input tuning circuit into an intermediate frequency signal having a predetermined center frequency;
 (c) an intermediate frequency signal processing circuit for passing only a given frequency range centering said intermediate frequency;
 (d) an AM detector for detecting an audio signal included in the output signal fed from said intermediate frequency signal processing circuit;
 (e) a narrow-band filter responsive to the output signal from said intermediate frequency signal processing circuit, the pass band of said narrow-band filter being narrower than that of said intermediate frequency signal processing circuit;
 (f) first means for detecting the magnitude of the output signal from said narrow-band filter for producing an output signal indicative of said magnitude; and
 (g) second means for varying the value of Q of said input tuning circuit in accordance with said output signal from said first means.
2. An AM signal receiver comprising:
 an input tuning circuit for selecting a desired AM radio frequency signal; and a signal processing circuit for demodulating the selected signal to obtain left and right channel audio signals, wherein the improvement comprises:
 (a) first means for detecting the amplitude of the received AM radio signal;
 (b) second means for detecting that the AM receiver is tuned to a stereo broadcasting signal; and
 (c) third means responsive to said first and second means for lowering the value of Q of said input tuning circuit when the AM receiver is receiving a stereo broadcasting signal having an intensity which is greater than a predetermined value.
3. An AM signal receiver comprising:
 (a) an input tuning circuit for selecting a desired AM radio frequency signal;
 (b) frequency-converting circuit for converting said selected AM radio frequency signal fed from said input tuning circuit into an intermediate frequency signal having a predetermined center frequency;
 (c) an intermediate frequency signal processing circuit for passing only a given frequency range centering said intermediate frequency;

(d) an AM detector for detecting a component, corresponding to the sum of the left and right channel signals, included in the output signal fed from said intermediate frequency signal processing circuit;

(e) a sub channel signal demodulating circuit for detecting a component, corresponding to the difference between the left and right channel signals, included in the output signal fed from said intermediate frequency signal processing circuit;

(f) a stereo identification signal detector responsive to the difference component from said sub channel signal demodulating circuit for producing an output signal in the pesence of said difference component;

(g) a matrixing circuit responsive to the sum component from said AM detector and to said difference component from said sub channel demodulating circuit for separating said left and right channels in the presence of the output signal from said stereo identification signal detector;

(h) first means for detecting the magnitude of the output signal from said intermediate frequency signal processing circuit for producing an output signal indicative of said magnitude; and (i) second means responsive to both said output signal from said stereo identification signal detector and said output signals from said first means for lowering the value of Q of said input tuning circuit only when said AM stereo signal receiver receives a stereo broadcasting signal having a level which is greater than a predetermined value.

4. An AM stereo signal receiver as claimed in claim 3, further comprising a narrow-band filter responsive to the output signal from said intermediate frequency signal processing circuit, the pass band of said narrow-band filter being narrower than that of said intermediate frequency signal processing circuit.

5. An AM signal receiver as claimed in claim 1 or 4, wherein said first means comprises an amplitude detector responsive to the output signal from said narrow-band filter, and an integrator for integrating the output signal of said amplitude detector.

6. An AM signal receiver as claimed in claim 1 or 3, wherein said second means comprises a semiconductor element controlled by said output signal from said first means, said semiconductor element being connected in parallel with a winding of an input tuning coil included in said input tuning circuit.

7. An AM signal receiver as claimed in claim 1 or 3, wherein said second means comprises a switching circuit controlled by said output signal from said first means, and a variable resistance element connected in series with said switching circuit, the series circuit being connected in parallel with a winding of an input tuning coil included in said input tuning circuit.

8. An AM signal receiver as claimed in claim 7, wherein said switching circuit comprises a semiconductor switch.

9. An AM signal receiver as claimed in claim 7, wherein said series circuit is cionnected to the primary winding of said input tuning coil, where said primary winding functions as an antenna or is connected to an external antenna.

10. An AM signal receiver as claimed in claim 7, wherein said series circuit is connected to the secondary winding of said input tuning coil, where said secondary winding is connected to a variable capacitor with which tuning is effected.

11. An AM signal receiver as claimed in claim 7, wherein said series circuit is connected to a pickup winding of said input tuning coil, where said pickup winding is used to derive a tuned AM radio frequency signal.

12. An AM signal receiver as claimed in claim 7, wherein said series circuit is connected to a winding additionally provided to said input tuning coil.

13. An AM signal receiver as claimed in claim 1, further comprising an amplifier provided between an intermediate frequency transformer included in said intermediate frequency signal processing circuit, and said narrow-band filter.

14. An AM signal receiver as claimed in claim 5, further comprising an amplifier interposed between an intermediate frequency amplifier included in said intermediate frequency signal processing circuit, and said narrow-band filter.

15. An AM signal receiver as claimed in claim 1 or 4, further comprising an amplifier provided between said narrow-band filter and said first means.

16. An AM signal receiver as claimed in claim 3, further comprising a manual switch for disabling said stereo identification signal detector when monaural signal reproduction is intended.

* * * * *